United States Patent [19]

Atkinson et al.

[11] Patent Number: 5,012,153
[45] Date of Patent: Apr. 30, 1991

[54] SPLIT COLLECTOR VACUUM FIELD EFFECT TRANSISTOR

[76] Inventors: Gary M. Atkinson, 1012 - 7th St., #15, Santa Monica, Calif. 90403; M. DuChesne Courtney, 15127 Blackhawk, Mission Hills, Calif. 91345

[21] Appl. No.: 455,217

[22] Filed: Dec. 22, 1989

[51] Int. Cl.$^5$ .................. H01J 21/16; H03K 3/353
[52] U.S. Cl. .................. 313/336; 313/309; 313/351; 307/304
[58] Field of Search .................. 313/309, 336, 351; 328/252, 258; 307/304

[56] References Cited

U.S. PATENT DOCUMENTS

| | | | |
|---|---|---|---|
| 3,755,704 | 8/1973 | Spindt et al. | 313/309 |
| 3,921,022 | 11/1975 | Levine | 313/309 |
| 4,498,952 | 2/1985 | Christensen | 313/309 X |
| 4,663,559 | 5/1987 | Christensen | 313/336 X |
| 4,721,885 | 1/1988 | Brodie | 313/336 |

OTHER PUBLICATIONS

Kathy Skidmore, "The Comeback of the Vacuum Tube: Will Semiconductor Versions Supplement Transistors?", Semiconductor International, Aug. 1988, pp. 15–17.

Gray et al., "A Vacuum Field Effect Transistor Using Silicon Field Emitter Arrays", IEDM, 1986, pp. 776–779.

*Primary Examiner*—Sandra L. O'Shea
*Attorney, Agent, or Firm*—Paul M. Coble; W. K. Denson-Low

[57] ABSTRACT

A vacuum FET is designed to perform higher level functions such as logic AND, EXCLUSIVE OR (NOR), demultiplexing, or frequency multiplication with a single device. These higher level functions are accomplished by dividing the collector of the vacuum FET into multiple segments and by providing steering electrodes just above the emitter to deflect the field emission current to the various collector segments. The collector pattern, together with the configuration of the applied signals to the device, determines the higher order function performed.

21 Claims, 8 Drawing Sheets

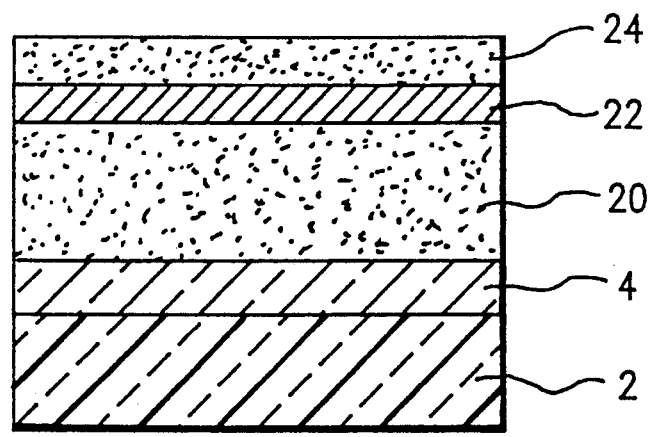
Fig.13.a.
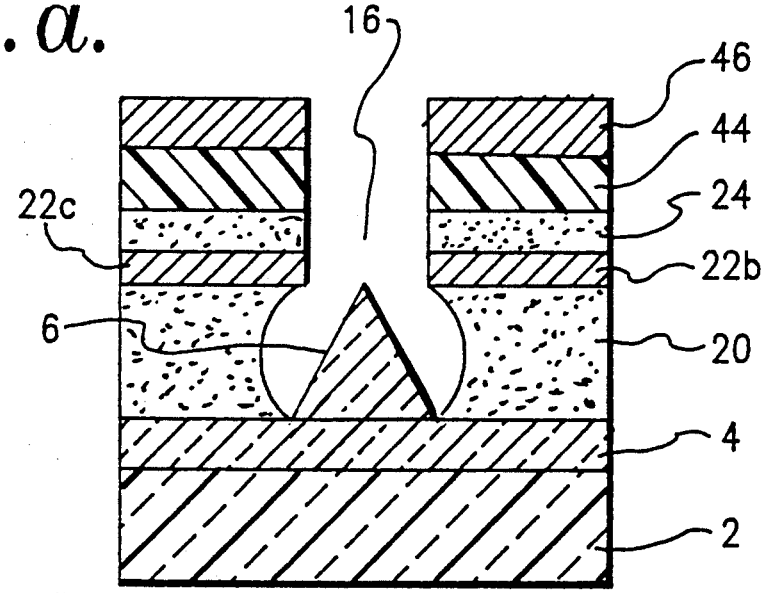
Fig.13.b.
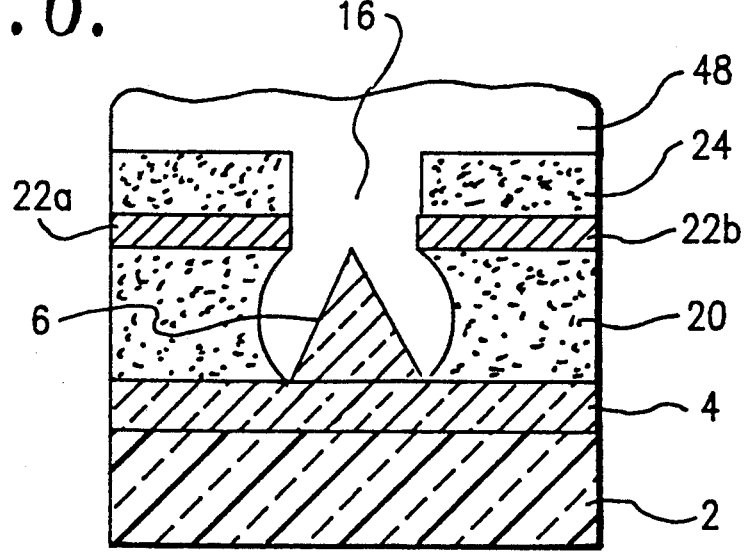
Fig.13.c.

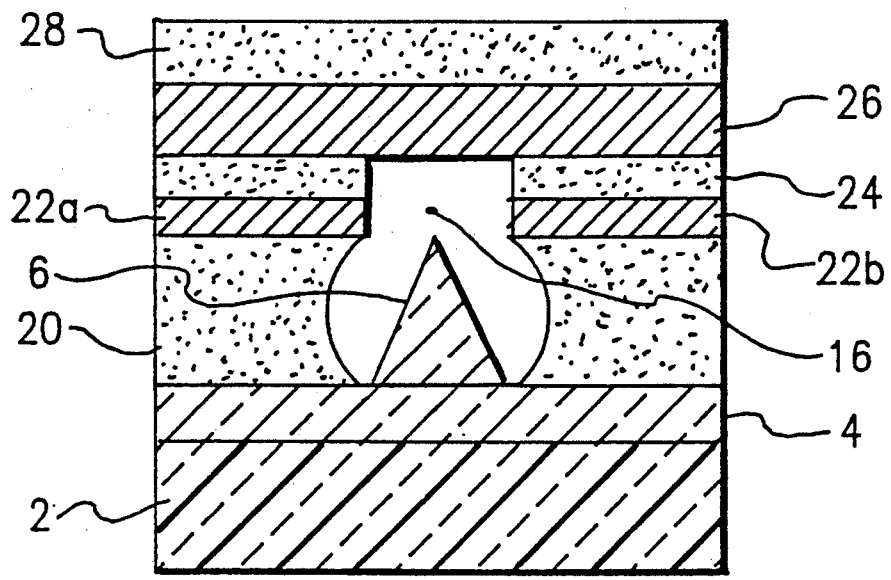
*Fig.13.d.*
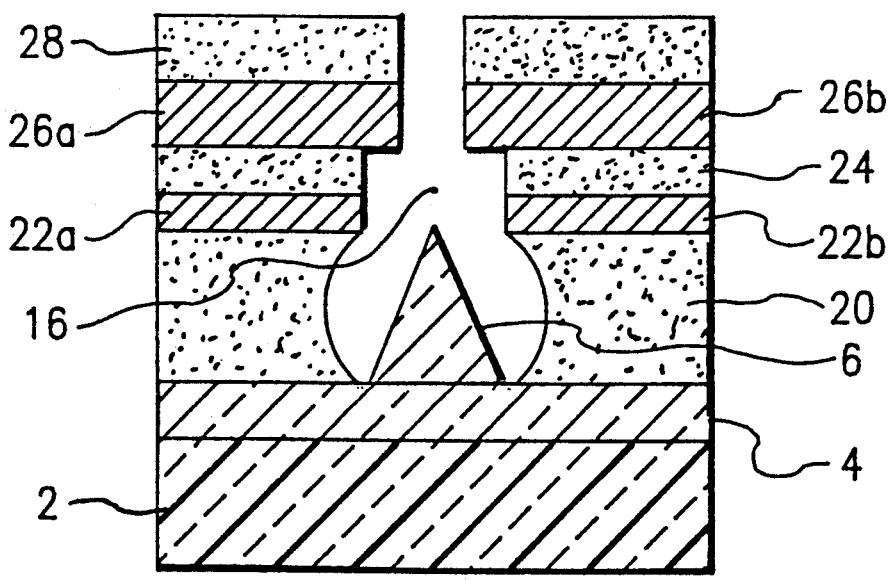
*Fig.13.e.*

SPLIT COLLECTOR VACUUM FIELD EFFECT TRANSISTOR

BACKGROUND OF THE INVENTION

1. Field of the Invention

This invention deals with an improvement to vacuum field effect transistors (FETs) having field emission cathode structures, and with circuits employing these devices.

2. Description of the Related Art

The first vacuum FET (also called a microelectronic tube) was announced in 1986 by Dr. Henry Gray of the Naval Research Laboratory. The announcement generated a considerable amount of interest, and stimulated further developments in the technology on an international scale.

The vacuum FET is basically an electron tube fabricated on a microelectronic scale using semiconductor processing techniques. Due to extremely small dimensions of the device (cathode tip to anode spacings are typically 0.5 micrometer), the mean free path of the electrons can be greater than the cathode tip to anode spacing, allowing vacuum tube type operation at pressures up to 1/100 to 1 atmosphere. The vacuum FET has distinct advantages over other semiconductor devices in terms of radiation hardness, extreme temperature insensitivity, very high speed operation and power efficiency, small and light weight packages, and relatively low cost. The development of the technology is reviewed in an article by Kathy Skidmore, "The Comeback of the Vacuum Tube: Will Semiconductor Versions Supplement Transistors?", *Semiconductor International*, August 1988, pages 15-18. The basic structure is described in U.S. Pat. No. 4,721,885 to Brodie.

The structure of the current vacuum FET is shown in FIG. 1. The device is formed on a substrate 2, which may be ceramic, glass, metal or silicon. A conductive layer 4 is deposited over the substrate. The electron emitter 6 may be formed either from silicon, or from a refractory metal such as molybdenum or tungsten. An insulating dielectric layer 8 such as silicon dioxide is then deposited over the conductive layer 4, followed by the deposition of a metal film 10 which functions as the gate electrode. Silicon is preferred for the conductive layer 4 because of the ease of growing the oxide 8 with a high dielectric strength over it. Dielectric layer 8 and gate electrode 10 are etched to form a gap around the periphery of electron emitter 6, with the tip of the electron emitter centered in the opening and approximately level with the upper gate electrode surface to maximize the electric field at the tip.

A second insulating layer 12 is then deposited over gate electrode 10 and etched to expose the electron emitter. A metal film 14 is deposited over dielectric layer 12 to form the anode or collector. The collector 14 covers an interior chamber 16 within the device, which is maintained at a partial vacuum generally within the range of 0.01 to 1 atmosphere.

In operation, a collector voltage $V_C$ is applied to collector plate 14 to extract an electron stream from emitter 6. The gate electrode 10 is biased by a gate control voltage $V_G$ to modulate the emitted current in an amplifier mode, or to switch the current emission on and off completely in a logic switching mode.

While vacuum FET technology has the distinct advantages discussed above, the standard device of FIG. 1 merely provides a basic amplifying or switching element. As with standard semiconductor transistors, a number of such devices must be connected together to perform higher level functions such as multiplexing, frequency multiplication, logical AND or EXCLUSIVE OR. In this sense, the basic vacuum FET provides no new functionality over existing solid state technologies.

SUMMARY OF THE INVENTION

The present invention extends the capabilities of the vacuum FET by providing for a variety of higher level functions in a single circuit element, thus adding new flexibility to solid state circuits based upon vacuum FETs. Reducing higher level functions into a single device structure also results in circuits that are simpler and more compact.

These advantages are realized by first dividing the collector of the vacuum FET into multiple segments, separated by electrically isolating gaps and secondly, dividing the gate electrode into two separate electrodes, which can be independently biased to steer the emitted current onto the different segments of the multiple collector. The segments of the collector can be electrically isolated from each other or connected together in various combinations, depending on the output function desired.

The electrical isolation of the separate collector segments is preferably implemented as one or more gaps through which the current can flow without striking the conductive collector segments. An electron sink is preferably positioned on the opposite side of the collector from the emitter, to capture electrons which pass through a collector gap. The electron sink is biased at or slightly more positive than the collector, allowing the current to pass freely through the gap and be absorbed by the electron sink.

Applications for the new vacuum FET include an AND gate, EXCLUSIVE OR gate, signal demultiplexer and frequency multiplier. As an AND gate, one input signal, applied between the cathode tip and the split collecting anodes, induces current emission from the cathode tip. The second input, applied between the steering gate electrodes, steers the emitted beam to the output of the device. When only the first input signal is applied, the emitted current passes straight through the device, passing through a central gap in the collector, and impinging on the electrically isolated electron sink plate so that no output voltage is generated. When only the second input signal is applied there is no emitted current, and again no output signal is generated. Only with the presence of both input signals is the current emission induced and steered to the proper collector segment of the device, generating an output voltage. With either of the inputs missing, the output voltage is zero.

When implemented as an EXCLUSIVE OR gate, both inputs are applied to the steering gate electrodes. The collector plates are electrically connected and biased positively, to induce a constant emission current from the tip. With no inputs or both of the inputs equally applied to the steering gate, the emitted current passes straight through the device, passing through a central gap in the collector, and impinging on the electrically isolated electron sink plate so that no output voltage is generated. With one or the other (but not both) of the input signals applied to the steering gate electrodes, the emitted current is steered to one of the collecting plates and generates an output voltage. An EXCLUSIVE NOR function can be obtained by reversing the conductive and non-conductive portions of the collector.

To operate as a signal demultiplexer, the collector is formed into at least two electrically isolated plates that are separated from each other by isolating gaps. Each separate collector segment is connected to a different output circuit for the device. A multiplexed input signal is applied to the steering electrode, and has superimposed upon it a steering signal which alternately steers the emitted current between the separate conductor plates in synchronism with the input signal multiplexing. The input signal is thus demultiplexed among the separate output circuits of the device.

To provide a frequency multiplier function, the collector is divided into at least three conductive segments which are mutually spaced apart from each other by isolating gaps. A sweep signal is applied to the steering electrode to sweep the emitter current across the conductive segments and isolating gaps, with an output produced each time the current strikes a conductive collector segment; the collector segments are preferably connected in common.

These and other features and advantages of the invention will be apparent to those skilled in the art from the following detailed description of preferred embodiments, taken together with the accompanying drawings, in which:

DESCRIPTION OF THE DRAWINGS

FIGS. 13a-13e are sectional views showing successive steps in the fabrication of a vacuum FET in accordance with the invention.

DETAILED DESCRIPTION OF THE INVENTION

The present invention integrates higher level circuit functions into a single vacuum FET device by dividing the collector into separate, electrically isolated conducting plates, and using the gate electrode as a steering electrode to direct an emitted electron stream onto a desired portion of the collector in accordance with an applied input signal. The output taken from the collector varies according to where the electron stream hits the collector, thereby allowing the FET to perform circuit functions in addition to the simple switching and amplification of prior vacuum FETs. Preferably, an electron sink behind the collector is biased at or slightly more positive than the collector plates in order to capture any electrons that pass through a collector gap, thus achieving the nonconductive segments of the divided collector.

Figure 1:
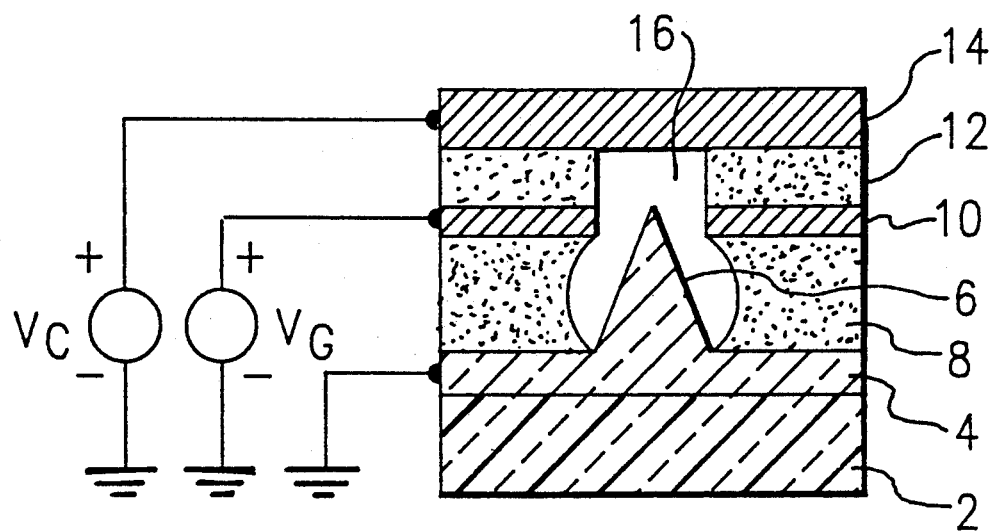
FIG. 1 is a sectional view of a prior art vacuum FET.
Figure 2:
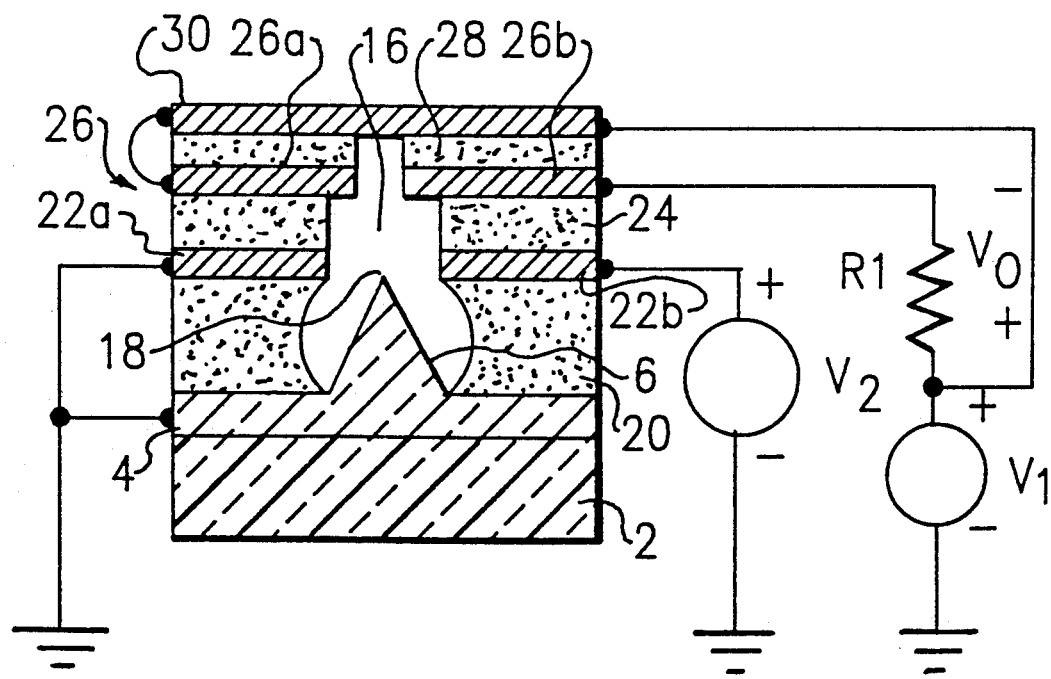
FIGS. 2 and 3 are respectively sectional and fragmentary plan views of a vacuum FET in accordance with the present invention implemented as an AND gate.

An implementation of the invention as an AND gate is shown in FIG. 2. The substrate 2, conductive layer 4 and emitter 6 may be the same as in the prior vacuum FET shown in FIG. 1. Emitter 6 extends upward from the floor of chamber 16, terminating in an electron emitting upper tip 18.

A dielectric layer 20 such as $SiO_2$ is formed over conductive layer 4. A steering electrode means in the form of a pair of individual steering gate electrodes 22a and 22b are positioned over dielectric layer 20 on opposite sides of chamber 16. Unlike the prior vacuum FET in FIG. 1, the steering gate electrodes are electrically isolated from each other so that they can be independently biased. Also unlike the prior vacuum FET of FIG. 1, in which the upper surface of gate electrode 10 is approximately even with the tip of electron emitter 6, in the device of FIG. 2 dielectric layer 20 has a greater vertical dimension so that steering electrodes 22a and 22b are positioned just above the level of electron emitting tip 18. This permits them to effectively steer the electron stream emitted from the tip.

Another dielectric layer 24 is formed over the steering electrodes and surmounted by a collector, generally indicated by reference numeral 26. Unlike the continuous collector plate 14 of the prior vacuum FET shown in FIG. 1, collector 26 is divided into two conductive sections 26a and 26b which are positioned on opposite sides of chamber 16. Collector sections 26a and 26b are electrically isolated from each other, and separated by a gap which is vertically aligned with the emitter tip.

Figures 3, 4:
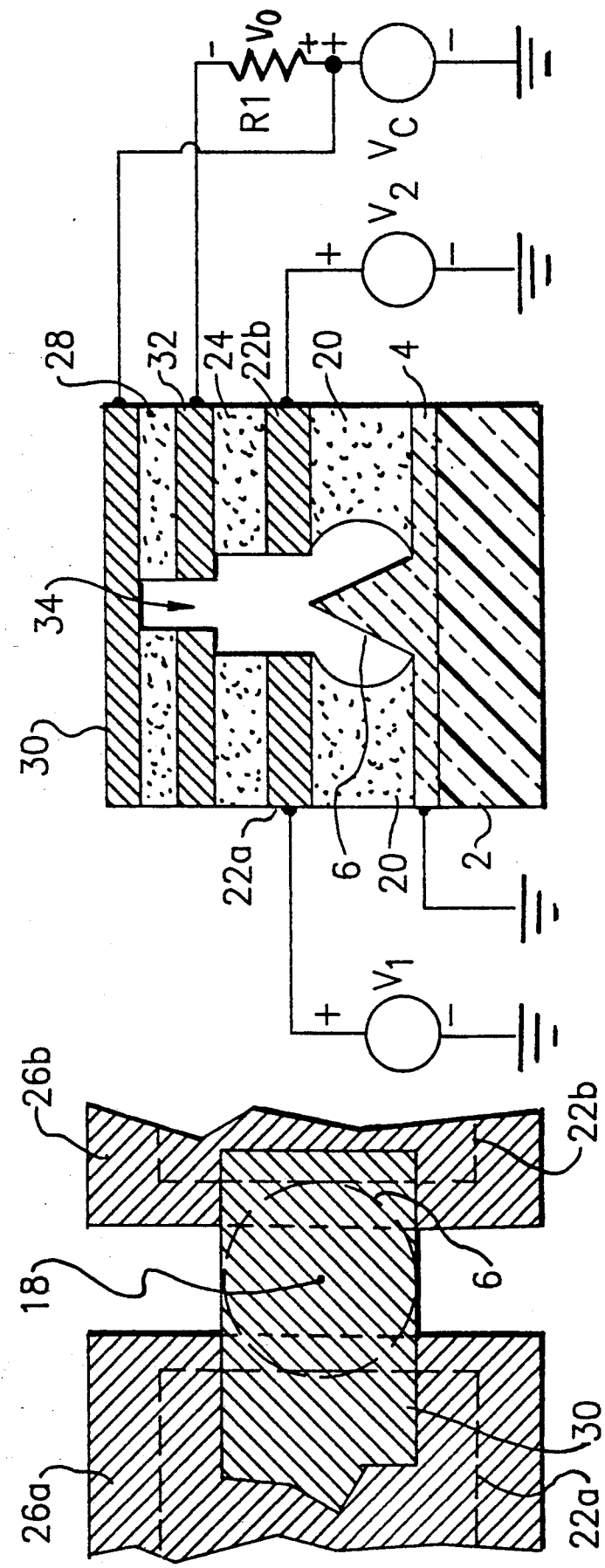
FIGS. 4 and 5 are respectively sectional and fragmentary plan views of a vacuum FET in accordance with the invention implemented as an EXCLUSIVE OR gate.

A third dielectric layer 28 is provided over the collector and forms a continuation of interior chamber 16 in alignment with the inside walls of second dielectric layer 24. Finally, a solid conductive plate 30, preferably formed from a metal, caps the device over dielectric layer 28. Conductive layer 30 serves as an electron sink to collect electrons from emitter 6 which flow either to or past the conductive collector sections, as described below. A plan view of electron sink 30, collector sections 26a, 26b and their vertical alignment with emitter 6 and steering electrodes 22a, 22b is shown in FIG. 3, in which visible elements are indicated by hatch lines.

The left-hand steering electrode 22a is held together with conductive layer 4 and emitter 6 at a reference voltage, preferably ground. One input electrical signal $V_1$ is applied to the current sink 30 and to collector sections 26a, 26b to induce an electron emission from emitter 6; the connection to collector section 26b is made through a resistor R1. A second input signal $V_2$ is connected to the right-hand steering electrode 22b. The output is taken as voltage $V_0$ across R1.

The electrostatic potential created by the application of $V_1$ induces electron emission from the emitting tip 6. The electric field generated by the application of $V_2$ is such that it steers the emitted beam toward collector plate 22b with a positive voltage.

If both signals $V_1$ and $V_2$ are applied, current is extracted from the emitting tip and diverted by the $V_2$ signal on gate electrode 22b to the right-hand collector section 26b. The current flows through resistor R1 from collector section 26b, producing an output voltage $V_0$ which indicates the presence of both input signals $V_1$ and $V_2$. If $V_1$ but not $V_2$ is present, an electron stream is extracted from emitter 6 but flows between the voltage balanced collector sections to be captured by electron sink 30, so that no output voltage $V_0$ appears across R1. If $V_2$ but not $V_1$ is present, no current is extracted from emitter 6 and again there is no output voltage across R1. The device thus functions as an AND gate, producing an output voltage only when both input signals are present.

The "nonconductive" portion of collector 26 comprises the gap between collector sections 26a and 26b together with an electron sink 30 situated behind the gap, biased at the same potential or slightly more positive than the collector plates. While this is the preferred embodiment, the term "nonconductive" can be broadly interpreted to mean nonconductive with respect to the output circuit R1. For example, if the collector gap were filled by a conductive current sink electrically isolated from output circuit R1, the device could still function as an AND gate within the scope of the invention.

Figure 5:
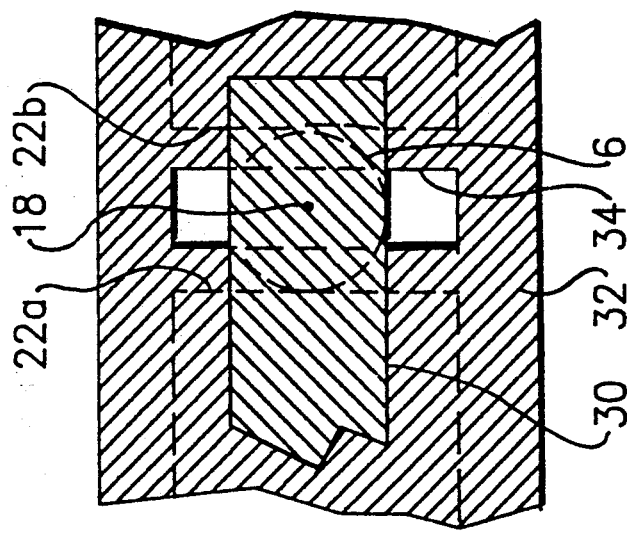

FIGS. 4 and 5 show an EXCLUSIVE OR gate using the new vacuum FET structure. In this embodiment the collector consists of a conductive plate 32 having a central slot 34 which is aligned over emitter 6 and parallel to steering electrodes 22a, 22b. Input signal sources $V_1$ and $V_2$ are connected to the steering electrodes 22a, 22b, respectively. A bias voltage source $V_C$ is connected to electron sink 30 and, through resistor R1 to the collector plate 32. In this embodiment therefore, the conducting collector segments are electrically connected in common.

$V_C$ induces a constant emission of electrons from emitter 6. When neither $V_1$ nor $V_2$ are present, the electron beam passes through the gap in the collector plate 32 formed by slot 34, and impinges upon electron sink 30. The output voltage $V_O$ across R1 is zero, under these conditions. If one or the other of the inputs $V_1$ or $V_2$ is high, the emitted electron beam is steered onto the conductive portion of the collector 32, causing a current to flow through R1, generating a positive output voltage $V_O$. If both input signals $V_1$ and $V_2$ are applied to steering electrodes 22a and 22b, the steering voltages balance each other so that the electron beam is again steered directly down the center axis of the device and through the nonconductive slot 34, so that the output $V_O$ is again zero.

A variation on the EXCLUSIVE OR device shown in FIGS. 4 and 5 would be to reverse the conductive and nonconductive portions of the collector, so that a conductive plate would occupy the area of slot 34 with the remainder of the collector open. In this instance the output circuit would be configured to go low ($V_o=0$) in response to one or the other of the inputs being applied and to go high ($V_o$=positive) when neither or both of the inputs are applied, thus providing an EXCLUSIVE NOR operation.

Figure 6:
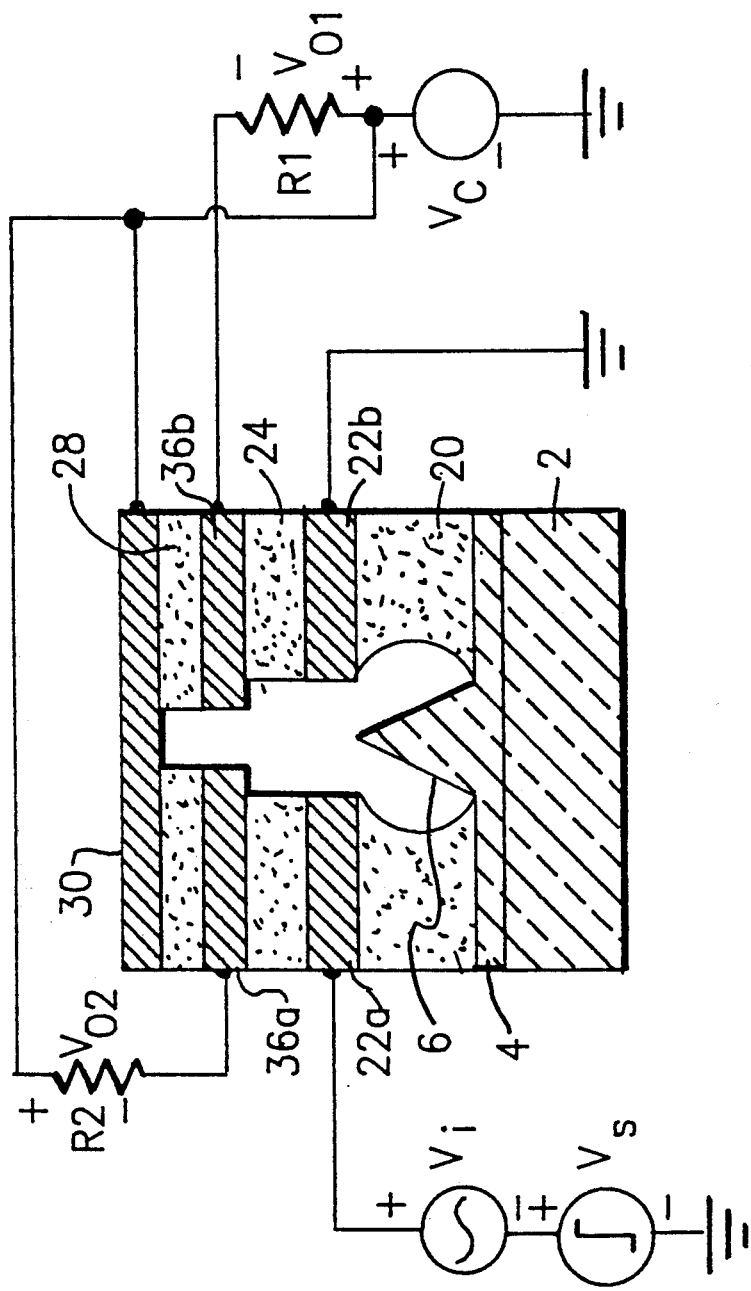
FIGS. 6 and 7 are respectively sectional and fragmentary plan views of a vacuum FET in accordance with the invention implemented as a signal demultiplexer.
Figure 7:
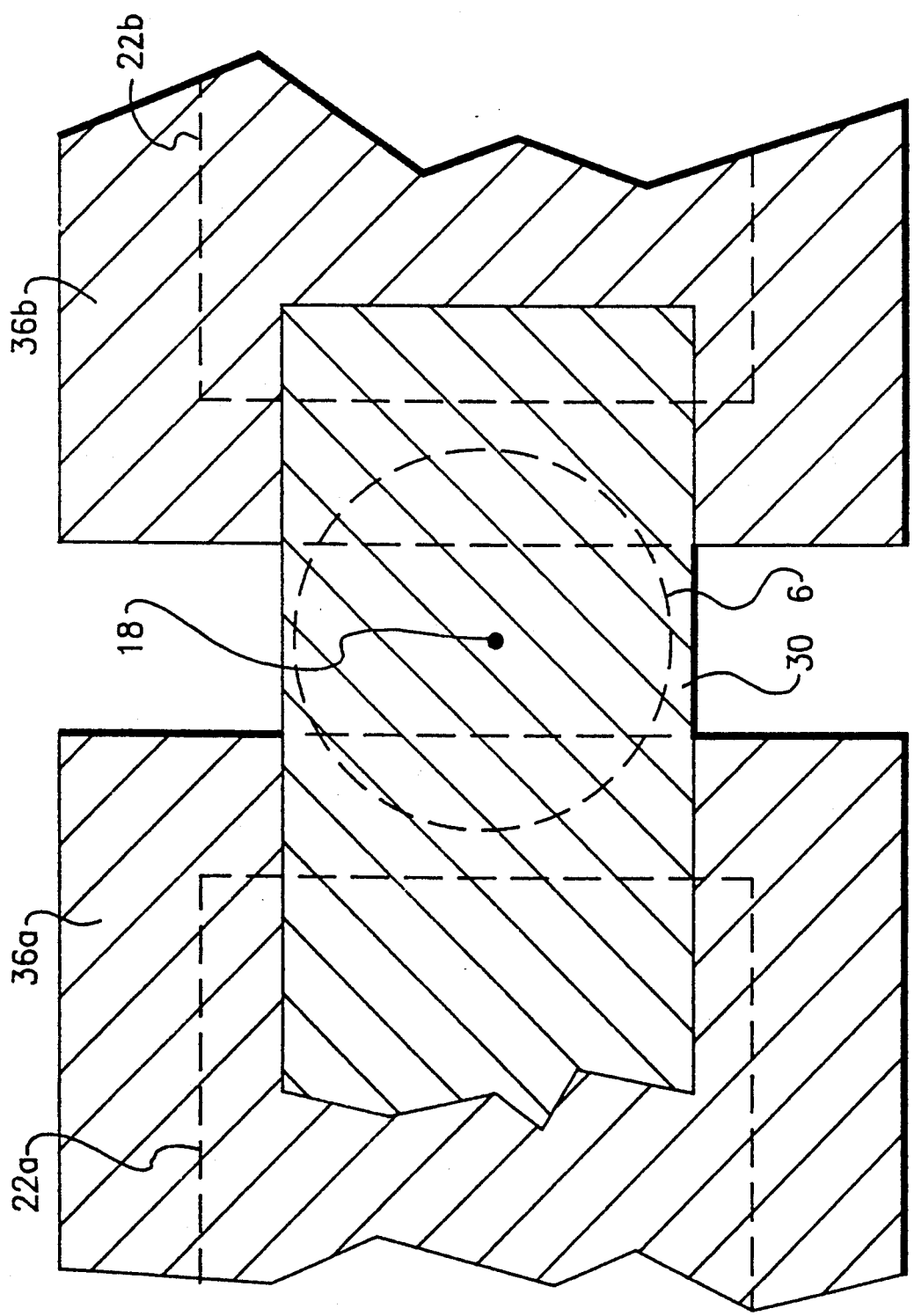

FIGS. 6 and 7 show another embodiment of the new vacuum FET, implemented as a signal demultiplexer. The collector consists of two conductive plates 36a, 36b which are spaced apart on opposite sides of the nonconductive gap and are electrically isolated from each other. Each collector section has an associated output circuit, resistor R1 for section 36a and resistor R2 for section 36b, with the output circuits supplied by source $V_C$. The $V_C$ source also applies a bias to the electron sink 30.

A multiplexed input signal $V_i$ is superimposed upon a steering signal $V_S$ and applied to steering electrode 22a, with the other steering electrode 22b grounded. Steering voltage $V_S$ alternates in synchronism with the multiplexing of the input signal $V_i$, thus switching the emitted electron beam between collector plates 36a and 36b in synchronism with the input signal multiplexing. Output circuit R1 thus obtains one of the multiplexed input signals, and output circuit R2 the other.

Figure 8:
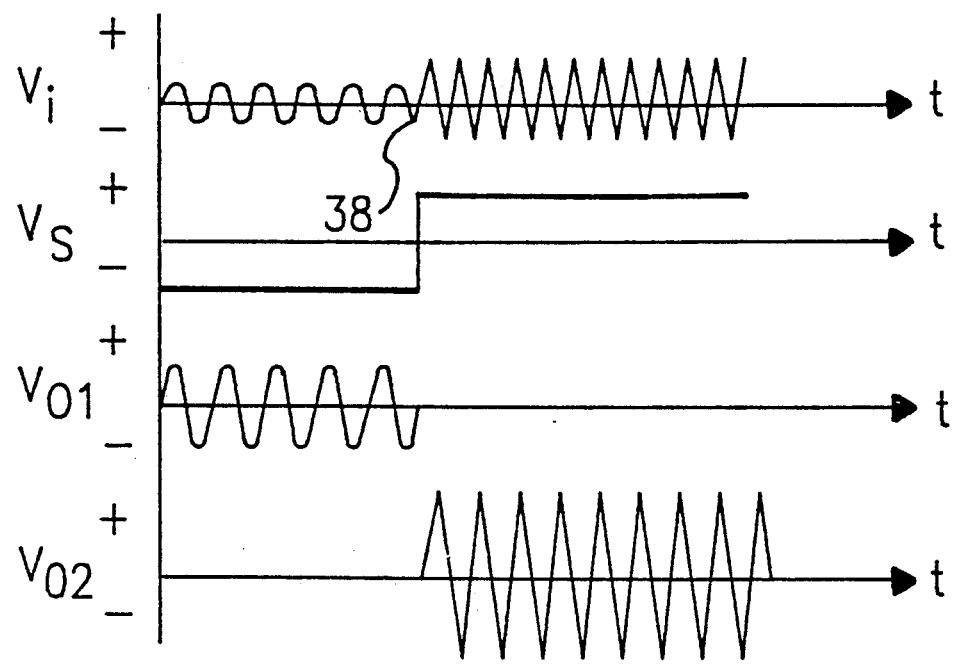
FIG. 8 illustrates the input and output signal waveforms for the demultiplexer device of FIGS. 6 and 7.

The pertinent signal waveforms are illustrated in FIG. 8. The multiplexed input signal $V_i$ shifts at time 38 from one input signal pattern to another. Prior to this time, steering voltage $V_S$ is negative, causing steering electrode 22a to repel emitted electrons and direct them onto conductive collector section 36b. This results in an output $V_{O1}$ across output resistor R1, with no output $V_{O2}$ across output resistor R2.

At time 38 $V_S$ goes positive, deflecting the emitted electron beam off of collector section 36b and onto collector section 36a. This results in an output $V_{O2}$ across output resistor R2, and no output $V_{O1}$ across output resistor R1. The steering voltage $V_S$ continues to periodically alternate in synchronism with the multiplexing of input signal $V_i$. Thus, the input signal is demultiplexed, with one of its constituent components appearing across R1 and the other across R2.

Figure 9:
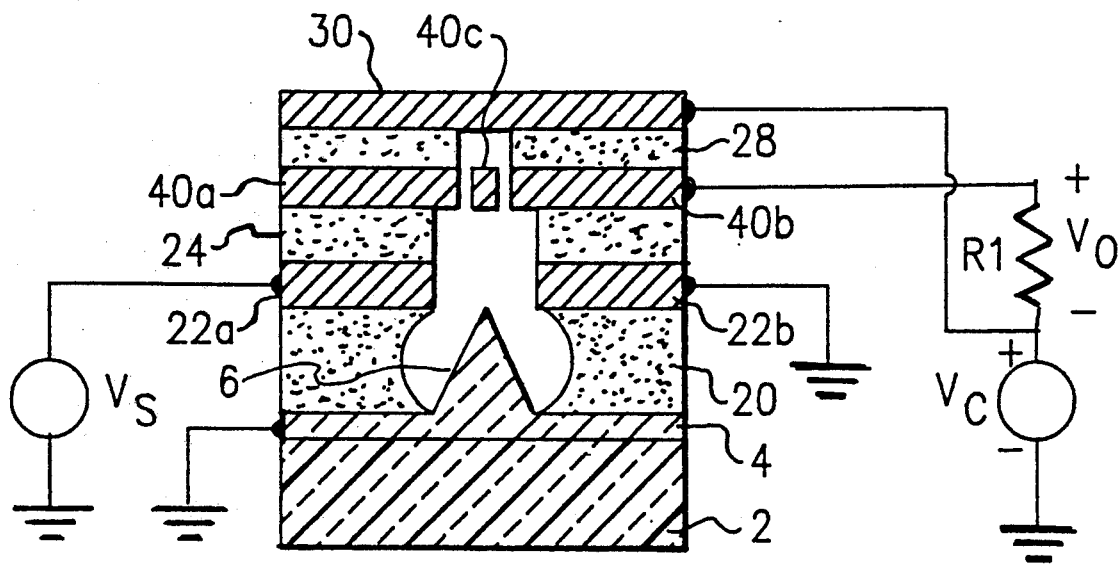
FIG. 9 is a sectional view of a vacuum FET in accordance with the invention implemented as a frequency multiplier.
Figure 10:
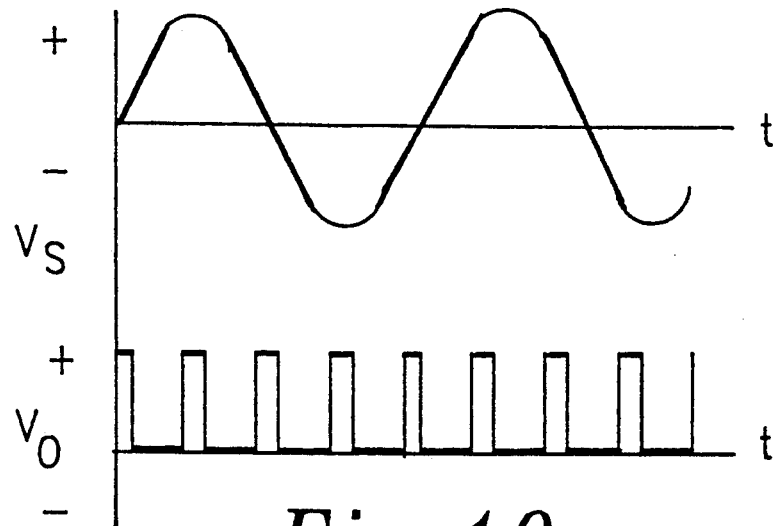
FIG. 10 illustrates the input and output signal waveforms for the signal multiplier of FIG. 9.
Figure 11:
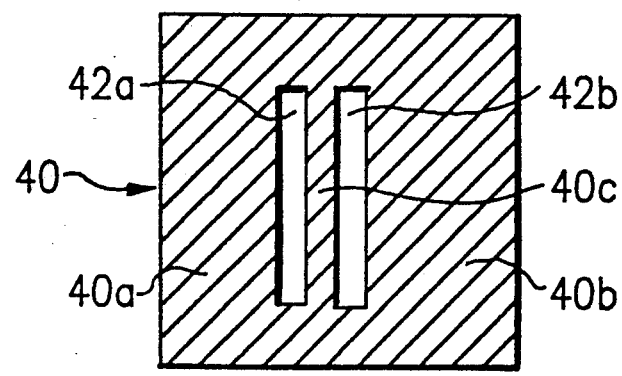
FIG. 11 is a plan view of a collector used with the device of FIG. 9.

The application of the invention to a frequency multiplier function is shown in FIGS. 9-11. In this embodiment the collector consists of at least three conductive sections 40a, 40b, 40c which are spaced apart by nonconductive segments. Although the conductive sections could be isolated from each other and provided with separate output circuits, they are preferably electrically connected in common. A simple collector construction for this purpose is shown in FIG. 11, in which the collector consists of a plate 40 having a pair of open parallel slots 42a, 42b. The conductive collector sections 40a, 40b and 40c consist of the plate portions on either side of the slots, and between the slots, respectively.

The bias voltage $V_C$ is connected to the electron sink 30 and, through resistor R1, to the collector plate 40. An alternating input sweep signal $V_S$ having a particular frequency is applied to one of the steering electrodes 22a, with the other steering electrode 22b grounded. Sweep voltage $V_S$ steers the electron beam from emitter 6 back and forth across the collector grid. As the beam passes over the grid, at any given time it either impinges upon one of the conductive grid portions 40a, 40b, 40c to cause a current to flow through output resistor R1, or passes through one of the collector slots 42a, 42b to be absorbed by electron sink 30. The resulting output waveform $V_O$ is illustrated in FIG. 10. Its frequency is a multiple of the input $V_S$ frequency, the multiplication factor depending upon the number of spaced conductive portions provided in the collector grid.

Figure 12:
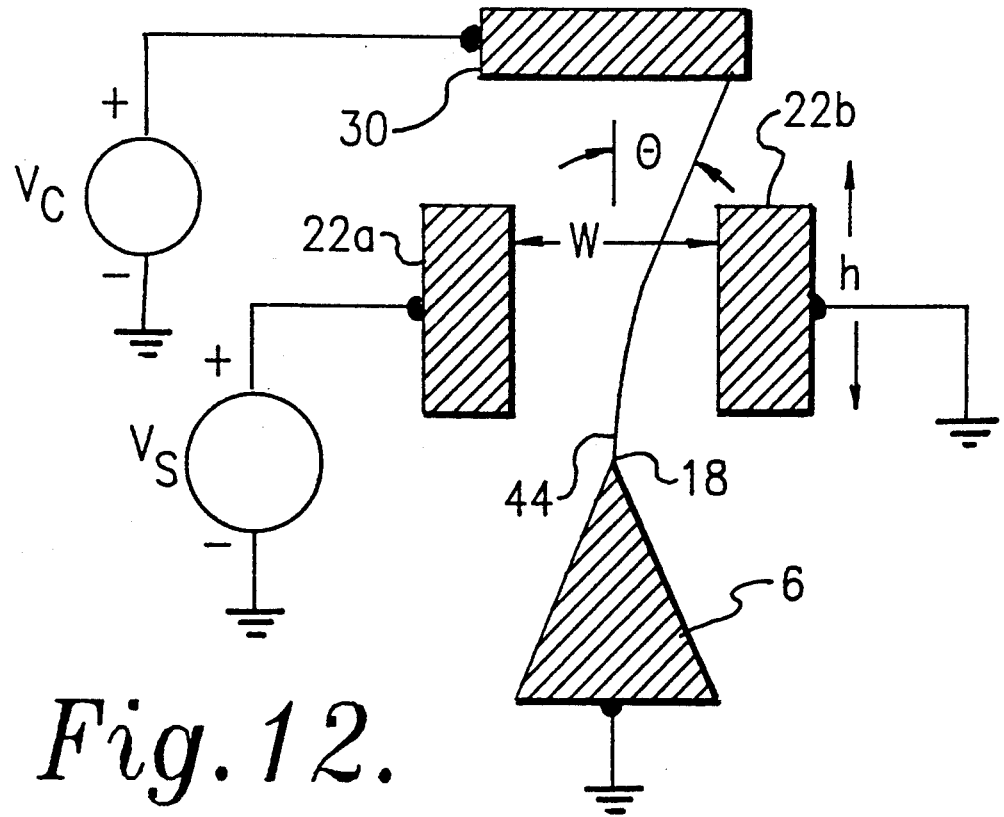
FIG. 12 is a functional diagram illustrating the electron current steering achieved with the invention.

The operation of the various vacuum FET implementations described above depends upon the ability to steer the emitter electron beam. The basic steering geometry is illustrated in FIG. 12. The angle $\theta$ by which the emitter electron beam 44 is deflected as it passes between the steering electrodes 22a, 22b can be calculated as a function of the steering voltage $V_S$ in accordance with the following formula:

$$\theta = \tan^{-1}(h/w)\left[\frac{V_S}{V_C - 2\phi_w/e}\right]$$

where $\phi_w$ is the work function of the emitting tip 18 and e is the electronic charge. This relationship implies that the geometry of the device can be tailored to provide a given angular deflection for the desired steering voltage $V_S$. The exact voltage levels required for $V_S$ will depend upon the work function and radius of the emitting tip, the necessary extraction voltage $V_C$, and the aspect ratios achievable in the fabrication process, which determine the height h of the steering electrodes and the spacing w between them.

One suitable fabrication process for the new split collector vacuum FET is illustrated in FIGS. 13a–13e. In FIG. 13a, the conductive layer 4 is grown upon a substrate 2 which is preferably formed from a ceramic, glass, metal or silicon, followed by the growth of oxide layer 20. A metal layer 22 which will later be formed into the steering electrodes is evaporated onto the oxide layer 20; a refractory metal is preferred because of its high melting point. An insulating layer such as Si$_3$N$_4$ is then deposited by a suitable process such as chemical vapor deposition over metal layer 22.

As illustrated in FIG. 13b, a photoresist layer 44 is next applied over insulator layer 24, with an opening left for the formation of chamber 16. The chamber may then be formed by a dry etch such as fluoride reactive ion etching for the insulator layer 24 and metal electrode layer 22, followed by a wet chemical etch such as buffered hydrofluoric acid solution for the oxide layer 20. The dry etch through insulator layer 24 and the gate electrode layer 22 gives the chamber substantially vertical walls in these areas, while the wet etch through oxide layer 20 expands the chamber laterally in this area. Once the chamber has been established, emitter cone 6 is formed by rotating the device during an angled metal evaporation process as described in Spindt et al., "Physical Properties of Thin-Film Field Emission Cathodes With Molybdenum Cathode Cones", *Journal of Applied Physics*, Vol. 47, No. 12, 1976, pages 5,248–5,263. The evaporation also deposits a layer of metal 46 over photoresist layer 44. The photoresist is then dissolved, which also removes the overlying metal layer 46.

In FIG. 13c a planarizing polymer 48 has been spun over the entire device, including the interior of chamber 16. The planarizing polymer is then etched back as with an oxygen plasma process until it is flush with the upper surface of dielectric layer 24, and the collector metal 26 is evaporated on top (FIG. 13d). Dielectric layer 28 is then formed over the collector layer.

The desired pattern of collector openings is next patterned and dry etched through the top dielectric layer 28 down to the collector, followed by patterning and etching away the desired openings from the collector itself. The result is shown in FIG. 13e for the AND gate of FIG. 2. At this point the previously applied planarizing polymer extends up to the bottom of the collector; additional polymer is spun on until it is flush with the upper surface of top dielectric layer 28. This provides a support for the electron sink 30, which consists of a solid metal plate evaporated over dielectric layer 28 and the planarizing polymer of chamber 16. The electron sink is lithographically patterned and etched as in FIGS. 3, 5 and 7, so as to provide an electrode over the central active area of the device and access ports to the chamber in the outlying area. The polymer remaining within chamber 16 is dissolved by flowing a suitable solvent into the chamber through the exposed portions of the collector slots on either side of the electron sink 30. The solvent should be selected so that it dissolves the planarizing polymer faster than the metal or dielectric layers forming the boundary of the chamber; solutions such as acetone and trichloroethane are suitable for this purpose.

Several embodiments of a new form of vacuum FET capable of performing various higher level functions with a single device have thus been shown and described. The specific examples given above are not to be taken as limiting, since numerous variations and alternate embodiments employing the invention can be envisioned. For example, the devices described above can be expanded into geometries with a larger number of output collector sections, to provide higher order frequency multiplication, multiplexing or logic functions. Accordingly, it is intended that within the scope of the appended claims the present invention can be practiced other than as specifically described.

We claim:

1. A vacuum field effect transistor (FET), comprising:
   an emitter configured to emit a current flow,
   a collector positioned in the path of said current flow, said collector having conductive and nonconductive portions,
   a steering electrode means disposed generally between the emitter and collector, and
   means for applying an electrical signal to said steering electrode for steering the current flow between the collector's conductive and nonconductive portions.

2. The vacuum FET of claim 1, further comprising an output circuit means connected to said collector and receiving therefrom an output signal determined by whether the current flow is incident upon the collector's conductive or nonconductive portions.

3. The vacuum FET of claim 1, said nonconductive collector portion comprising at least one gap in the collector through which the current can flow without substantially striking the conductive portion of the collector.

4. The vacuum FET of claim 3, further comprising an electron sink on the opposite side of the collector from the emitter for capturing electrons which pass through a collector gap.

5. The vacuum FET of claim 4, further comprising means for applying an electrical bias to said electron sink to attract electrons from the emitter.

6. The vacuum FET of claim 1, implemented as an AND gate to indicate the simultaneous presence of first and second input signals, further comprising means to connect the first input signal to induce a current emission from the emitter, means to connect the second input signal to the gate to steer the emitted current to a conductive portion of the collector, the emitted current being directed to a nonconductive portion of the collector in the absence of said second input signal, and output means connected to sense the presence of the emitted current on said conductive collector portion.

7. The vacuum FET of claim 1, implemented as an EXCLUSIVE OR gate to indicate the presence of either one but not both of first and second input signals, said steering electrode means comprising a pair of electrode elements which are electrically isolated from each other and positioned to steer the current in opposite directions, said electrode elements steering the current onto first areas of the collector of like conductivity in response to one or the other but not both of said input signals, said current being directed onto a second area of the collector of opposite conductivity to said first areas in the absence of said input signals, and further comprising output means connected to determine whether said emitted current is on said first or second collector areas.

8. The vacuum FET of claim 7, wherein said electrode elements substantially balance each other in response to the simultaneous presence of both input signals to keep the current directed substantially onto said second collector area.

9. The vacuum FET of claim 1, implemented as a signal demultiplexer, said collector comprising at least two conductive collector elements spaced and electrically isolated from each other by a nonconductive collector element, and further comprising means for applying an input multiplexed signal onto said steering electrode, means for superimposing upon said multiplexed signal a steering signal which alternately steers the emitted current between said conductive collector elements in synchronism with the multiplexing of the input signal, whereby the input signal is demultiplexed among said conductive collector elements, and output means responsive to the emitted current striking said conductive collector elements.

10. The vacuum FET of claim 1, implemented as a frequency multiplier, said collector comprising at least three conductive segments mutually spaced by nonconductive segments, and further comprising means for applying a sweep signal to said steering electrode to sweep the emitted current across said conductive and nonconductive segments, and output means responsive to the emitted current striking a conductive collector segment.

11. The vacuum FET of claim 10, wherein said conductive collector segments are electrically connected in common.

12. A vacuum field effect transistor (FET), comprising:
a housing,
a chamber within said housing having a floor and an upper boundary,
an emitter extending upward from the chamber floor to an electron emitting tip,
a conductive layer forming the upper chamber boundary for receiving an applied voltage to induce the emission of an electron stream from the emitter tip towards said conductive layer, said conductive layer sinking incident electrons from the electron stream,
a plurality of steering electrodes positioned to steer the electron stream from the emitter in response to applied steering signals,
a collector formed from a conductive material and positioned between the steering electrodes and the conductive layer, said collector including at least one gap therein permitting electrons from the emitter to flow through the collector to the conductive layer in response to a predetermined steering signal, and
insulative layers between the emitter and steering electrodes, between the steering electrodes and collector, and between the collector and conductive layer, respectively.

13. The vacuum FET of claim 12, wherein said steering electrodes are positioned above the level of said emitter tip.

14. The vacuum FET of claim 12, said collector comprising first and second conductive elements which are positioned on opposite sides of the chamber, electrically isolated from each other and separated by a gap aligned with the emitter tip.

15. The vacuum FET of claim 14, implemented as an AND gate to indicate the simultaneous presence of first and second input signals, further comprising means to connect the first input signal to said conductive layer and to the first conductive collector element, means to connect the second input signal to a steering electrode on the opposite side of the chamber from the first conductive collector element, and output means connected to the second conductive collector element.

16. The vacuum FET of claim 14, implemented as a signal demultiplexer, and further comprising means for applying an input multiplexed signal onto one of said steering electrodes, means for superimposing upon said multiplexed signal a steering signal which alternately steers the electron stream between said first and second conductive collector elements in synchronism with the multiplexing of the input signal, whereby the input signal is demultiplexed among said collector elements, and respective output means connected to each of said collector elements.

17. The vacuum FET of claim 12, wherein a pair of steering electrodes are spaced apart on opposite sides of the chamber, said collector comprising a single conductive plate having a gap extending through its interior in general alignment with the spacing between the steering electrodes.

18. The vacuum FET of claim 17, implemented as an EXCLUSIVE OR gate to indicate the presence of either one but not both of first and second input signals, further comprising means for connecting said first and second input signals to respective steering electrodes, and output means connected to said collector plate, the electron stream passing through the collector gap in response to the presence of neither or both of the input signals, and hitting the collector plate in response to the presence of either one but not both of the input signals.

19. The vacuum FET of claim 17, said conductive collector plate having a plurality of spaced gaps within the chamber along the steering path of the electron stream.

20. The vacuum FET of claim 19, implemented as a frequency multiplier, further comprising means for applying a sweep signal to at least one of said steering electrodes to sweep the electron stream across the collector and said gaps, and output means connected to the collector plate and responsive to each occasion of the current stream striking the collector after traversing a gap.

21. The vacuum FET of claim 12, further comprising an electron sink on the opposite side of the collector from the emitter for capturing electrons which pass through a collector gap.

* * * * *